(12) United States Patent
Pianin et al.

(10) Patent No.: US 11,650,247 B2
(45) Date of Patent: May 16, 2023

(54) MULTIPLE SENSE POINTS FOR ADDRESSING A VOLTAGE GRADIENT

(71) Applicant: Cisco Technology, Inc., San Jose, CA (US)

(72) Inventors: Jerrold Mark Pianin, Peoria, AZ (US); Joel Goergen, Soulsbyville, CA (US); Shobhana Ram Punjabi, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 155 days.

(21) Appl. No.: 17/344,539

(22) Filed: Jun. 10, 2021

(65) Prior Publication Data

US 2022/0397599 A1 Dec. 15, 2022

(51) Int. Cl.
*G01R 31/28* (2006.01)

(52) U.S. Cl.
CPC .................. *G01R 31/2884* (2013.01)

(58) Field of Classification Search
CPC .................................. G01R 31/2884
USPC .................. 324/762.01, 537, 500
See application file for complete search history.

(56) References Cited

U.S. PATENT DOCUMENTS

| | | | |
|---|---|---|---|
| 8,803,544 B2 * | 8/2014 | Ku | G01R 31/2884 324/762.01 |
| 9,891,271 B2 * | 2/2018 | Schreiber | G01R 31/2884 |
| 2006/0288201 A1 | 12/2006 | Brown et al. | |
| 2007/0271473 A1 | 11/2007 | Hosomi | |
| 2009/0085551 A1 | 4/2009 | Barrenscheen et al. | |
| 2016/0003893 A1 | 1/2016 | Ibrahimovic et al. | |
| 2016/0091561 A1 * | 3/2016 | Knight | G01R 31/31719 324/750.3 |
| 2016/0357245 A1 | 12/2016 | Heo et al. | |

* cited by examiner

*Primary Examiner* — Giovanni Astacio-Oquendo
(74) *Attorney, Agent, or Firm* — Merchant & Gould P.C.

(57) ABSTRACT

Regulation of a voltage gradient may be provided. A plurality of test voltage values associated with a corresponding plurality of locations associated with an electronic device may be received. Then, based on the plurality of test voltage values, a target setpoint may be determined for a power supply that supplies power to the electronic device. The target setpoint may be configured to cause a maximum of voltage values at the plurality of locations to be below a maximum voltage level defined by a specification for the electronic device. The target setpoint may also be configured to cause a minimum of the voltage values at the plurality of locations to be above a minimum voltage level defined by the specification for the electronic device. The power supply may then be driven at the target setpoint.

20 Claims, 3 Drawing Sheets

MULTIPLE SENSE POINTS FOR ADDRESSING A VOLTAGE GRADIENT

TECHNICAL FIELD

The present disclosure relates generally to regulating a voltage gradient.

BACKGROUND

An Application-Specific Integrated Circuit (ASIC) is an integrated circuit (IC) chip customized for a particular use, rather than intended for general-purpose use. For example, a chip designed to run in a digital voice recorder or a high-efficiency cryptocurrency miner may comprise an ASIC. Application-specific standard product (ASSP) chips are intermediate between ASICs and industry standard integrated circuits. ASIC chips are typically fabricated using Metal-Oxide-Semiconductor (MOS) technology, as MOS integrated circuit chips.

As feature sizes have shrunk and design tools improved over the years, the maximum complexity (and hence functionality) possible in an ASIC has grown from 5,000 logic gates to over 100 million. Modern ASICs often include entire microprocessors, memory blocks including ROM, RAM, EEPROM, flash memory and other large building blocks. Such an ASIC may be referred to as a System-on-Chip (SoC). Designers of digital ASICs often use a Hardware Description Language (HDL), such as Verilog or VHSIC Hardware Description Language (VHDL), to describe the functionality of ASICs.

An ASIC may be disposed on a Printed Circuit Board (PCB) that may mechanically support and electrically connect electrical or electronic components using conductive tracks, pads, and other features etched from one or more sheet layers of copper laminated onto and/or between sheet layers of a non-conductive substrate. Components are generally soldered onto the PCB to both electrically connect and mechanically fasten them to it. A power supply may be included with the PCB to supply power to the ASIC or electronic components on the PCB.

BRIEF DESCRIPTION OF THE FIGURES

The accompanying drawings, which are incorporated in and constitute a part of this disclosure, illustrate various embodiments of the present disclosure. In the drawings.

DETAILED DESCRIPTION

Overview

Figure 1:
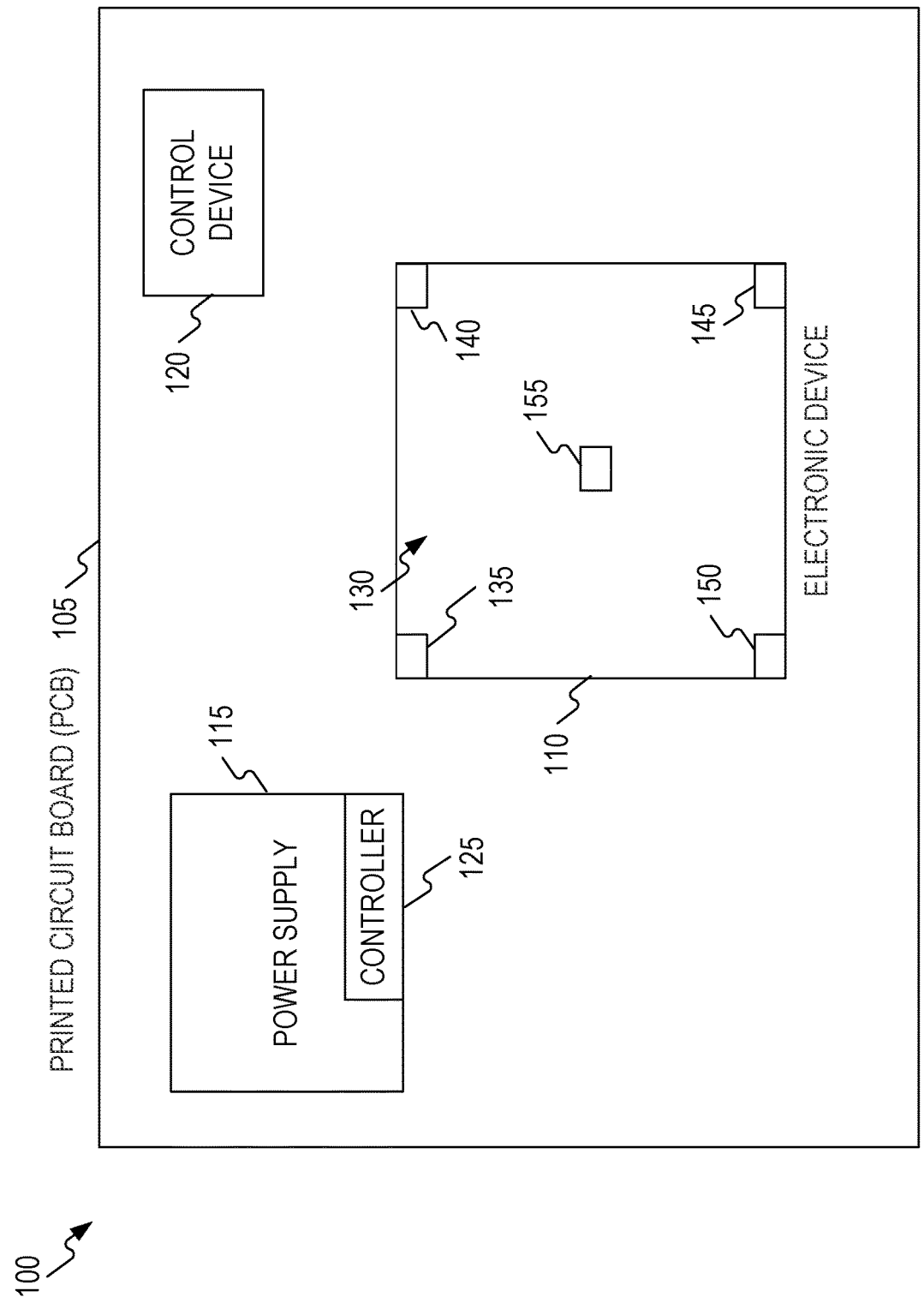
FIG. 1 is a block diagram of an operating environment for providing regulation of a voltage gradient.

Regulation of a voltage gradient may be provided. A plurality of test voltage values associated with a corresponding plurality of locations associated with an electronic device may be received. Then, based on the plurality of test voltage values, a target setpoint may be determined for a power supply that supplies power to the electronic device. The target setpoint may be configured to cause a maximum of voltage values at the plurality of locations to be below a maximum voltage level defined by a specification for the electronic device. The target setpoint may also be configured to cause a minimum of the voltage values at the plurality of locations to be above a minimum voltage level defined by the specification for the electronic device. The power supply may then be driven at the target setpoint.

Both the foregoing overview and the following example embodiments are examples and explanatory only and should not be considered to restrict the disclosure's scope, as described and claimed. Furthermore, features and/or variations may be provided in addition to those described. For example, embodiments of the disclosure may be directed to various feature combinations and sub-combinations described in the example embodiments.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

A Point of Load (POL) controller (i.e., controller) may sense and regulate a voltage at only one on-die sense point on an electronic device (e.g., an ASIC). In large, high current, electronic devices, maintaining an ideal voltage drop between pins with one on-die sense point may be challenging because the voltage drop (or gradient) across the electronic device may be dynamic and difficult to predict depending on electronic device use cases.

Consistent with embodiments of the disclosure, a power supply may supply power to an electronic device (e.g., a multi-pin electronic device or an ASIC) disposed on a circuit board. The electronic device may have a maximum voltage level and a minimum voltage level defined by a specification for the electronic device that it is to be supplied in order to stay within the specification defined by the manufacturer of the electronic device. A plurality of voltage levels respectively corresponding to a plurality of different sense points (i.e., locations) in the electronic device may be sensed. A supply voltage level of the power supply may then be adjusted to a voltage level that may keep: i) a maximum of the plurality of voltage levels below the maximum voltage level defined by the specification for the electronic device; and ii) a minimum of the plurality of voltage levels above the minimum voltage level defined by the specification for the electronic device. This process may be performed by the power supply, by the electronic device (e.g., ASIC) itself, or by hardware/software (e.g., a control device) outside the power supply and electronic device. The plurality of voltage levels may be sensed and outputted by internal voltage monitors in the electronic device (e.g., ASIC) or the plurality of voltage levels may be sensed from external monitors at pins from the electronic device on the circuit board on which the electronic device is disposed. Furthermore, the plurality of voltage levels may be sensed from a plurality of sense points on the circuit board underneath the electronic device.

In addition, software may be used to predict an increase in current/load on the electronic device using a packet engine look-ahead type process. The change in voltage setpoint of the power supply may be communicated early enough so that the voltage setpoint may be adjusted as the voltage gradient increases for example.

FIG. 1 shows an operating environment 100 for providing regulation of a voltage gradient. As shown in FIG. 1, operating environment 100 may comprise a Printer Circuit Board (PCB) 105, an electronic device 110, a power supply 115, and a control device 120. Electronic device 110, power supply 115, and control device 120 may be disposed on PCB 105. Power supply 115 may be controlled by controller 125 and may supply power to electronic device 110 and control device 120. Electronic device 110 may comprise, but is not limited to, a multi-pin electronic device, an ASIC, a microprocessor, or any other Integrated Circuit (IC) chip. Control device 120 may comprise, but is not limited to, a Field-Programmable Gate Array (FPGA).

Electronic device 110 may include a plurality of locations 130 (i.e., sense points) associated with electronic device 110. For example, plurality of locations 130 may comprise a first location 135, a second location 140, a third location 145, a fourth location 150, and a fifth location 155. While FIG. 1 illustrates plurality of locations 130 comprising five locations, plurality of locations 130 may comprise any number of locations and is not limited to five. As shown in FIG. 1, plurality of locations 130 may include the corners of electronic device 110 and the center of electronic device 110. However, embodiments of the disclosure are not limited to these locations and they may be located anywhere on electronic device 110.

Consistent with embodiments of the disclosure, plurality of locations 130 may comprise a corresponding plurality of voltage monitors located in electronic device 110. Consistent with other embodiments of the disclosure, plurality of locations 130 may comprise a corresponding plurality of pins external to electronic device 110 that may be associated with a corresponding plurality voltage monitors located in electronic device 110. Consistent with yet other embodiments of the disclosure, plurality of locations 130 may comprise a corresponding plurality of sense points on PCB 105 underneath electronic device 110.

The elements described above of operating environment 100 (e.g., electronic device 110, power supply 115, control device 120, or controller 125) may be practiced in hardware and/or in software (including firmware, resident software, micro-code, etc.) or in any other circuits or systems. The elements of operating environment 100 may be practiced in electrical circuits comprising discrete electronic elements, packaged or integrated electronic chips containing logic gates, a circuit utilizing a microprocessor, or on a single chip containing electronic elements or microprocessors. Furthermore, the elements of operating environment 100 may also be practiced using other technologies capable of performing logical operations such as, for example, AND, OR, and NOT, including but not limited to, mechanical, optical, fluidic, and quantum technologies. As described in greater detail below with respect to FIG. 3, the elements of operating environment 100 may be practiced in a computing device 300.

Figure 2:
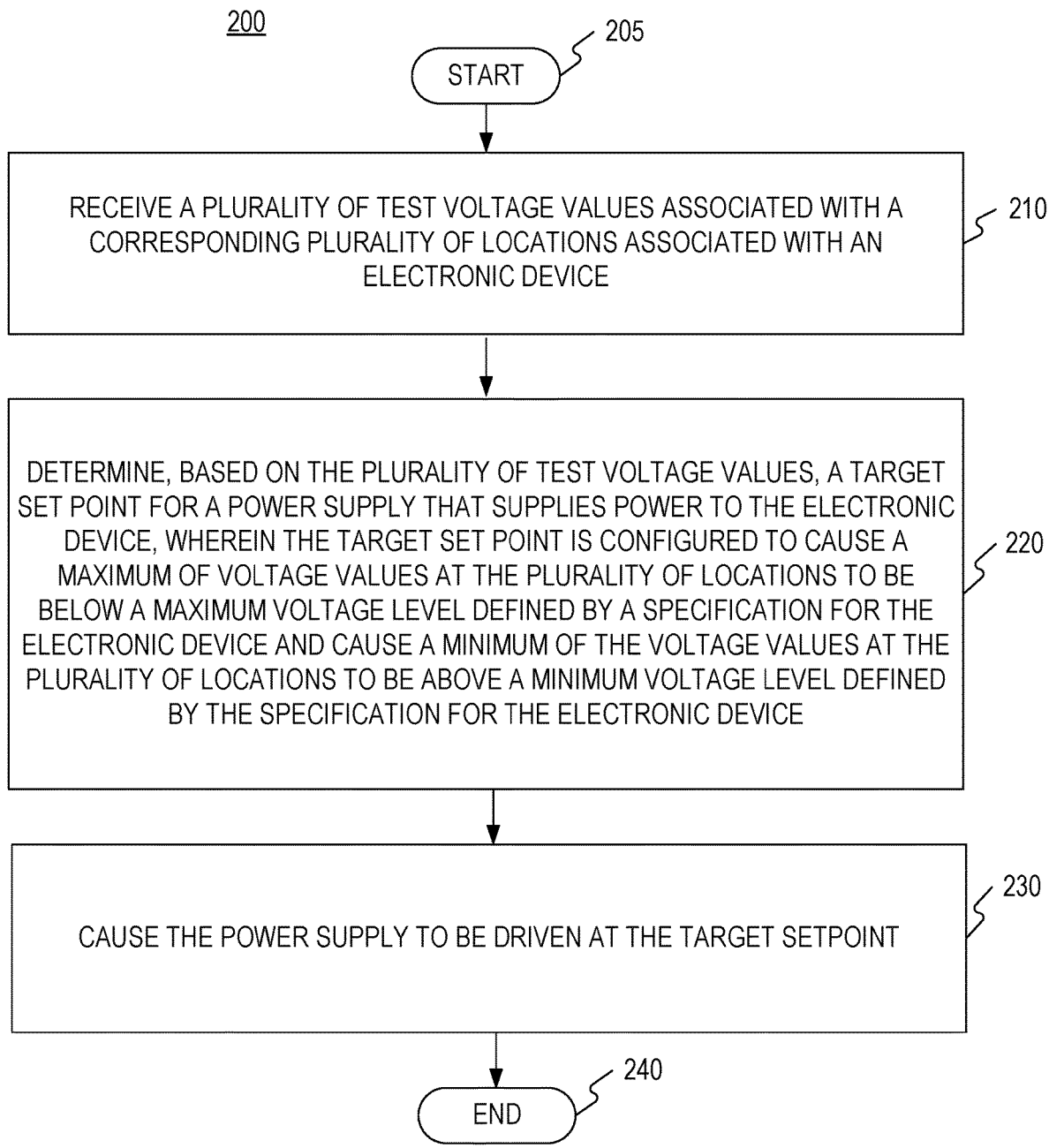
FIG. 2 is a flow chart of a method for providing regulation of a voltage gradient.

FIG. 2 is a flow chart setting forth the general stages involved in a method 200 consistent with an embodiment of the disclosure for providing regulation of a voltage gradient. Method 200 may be implemented by control device 120, controller 125 of power supply 115, or by elements of electronic device 110 for example. Ways to implement the stages of method 200 will be described in greater detail below.

Method 200 may begin at starting block 205 and proceed to stage 210 where a plurality of test voltage values associated with corresponding plurality of locations 130 associated with electronic device 110 may be received. For example, consistent with embodiments of the disclosure, plurality of locations 130 may comprise a corresponding plurality of voltage monitors located in electronic device 110. With this embodiment, electronic device 110 itself may receive and collect the plurality of test voltage values associated with corresponding plurality of locations 130 from the corresponding plurality of voltage monitors located internally within electronic device 110. With this embodiment, in response to receiving and collecting the plurality of test voltage values, electronic device 110 itself may determine the target setpoint as described in more detail below with respect to stage 220.

Consistent with other embodiments of the disclosure, plurality of locations 130 may comprise a corresponding plurality of pins external to electronic device 110 that may be associated with a corresponding plurality voltage monitors located in electronic device 110. With this embodiment, controller 125 of power supply 115 or control device 120 may receive and collect the plurality of test voltage values associated with the corresponding plurality of pins external to electronic device 110 that may be associated with the corresponding plurality voltage monitors located in electronic device 110. With this embodiment, in response to receiving and collecting the plurality of test voltage values, controller 125 of power supply 115 or control device 120 may determine the target setpoint as described in more detail below with respect to stage 220.

Consistent with yet other embodiments of the disclosure, plurality of locations 130 may comprise a corresponding plurality of sense points on PCB 105 underneath electronic device 110. With this embodiment, controller 125 of power supply 115 or control device 120 may receive and collect the plurality of test voltage values associated with the corresponding plurality of sense points on PCB 105 underneath electronic device 110. With this embodiment, in response to receiving and collecting the plurality of test voltage values, controller 125 of power supply 115 or control device 120 may determine the target setpoint as described in more detail below with respect to stage 220. Neither the plurality voltage monitors located in electronic device 110 nor pins external to electronic device 110 that may be associated with the corresponding plurality voltage monitors located in electronic device 110 may be used with this embodiment. Rather the plurality of test voltage values may be associated with the corresponding plurality of sense points on PCB 105 underneath electronic device 110 instead.

From stage 210, where the plurality of test voltage values associated with corresponding plurality of locations 130 associated with electronic device 110 are received, method 200 may advance to stage 220 where, a target setpoint for power supply 115 that supplies power to electronic device 110 may be determined based on the plurality of test voltage values. The target setpoint may be configured to cause a maximum of the voltage values at plurality of locations 130 to be below a maximum voltage level defined by a specification for electronic device 110. In addition, the target setpoint may be configured to cause a minimum of the voltage values at plurality of locations 130 to be above a minimum voltage level defined by the specification for electronic device 110.

In some embodiments, electronic device 110 may sense the plurality of test voltage values on-die from internal sense points (e.g., internal voltage monitors) and may itself determine the target setpoint for power supply 115. Electronic device 110 may then communicate the target setpoint for power supply 115 to controller 125 of power supply 115. This approach may compensate for voltage drop in electronic device 110 since it may rely on voltage sense information on-die. With this approach there may only be one on-die point on electronic device 110 that may be monitored by controller 125 thus saving hardware overhead for both controller 125 and electronic device 110. In other words, the target setpoint may be communicated from one pin on electronic device 110 and controller 125 may monitor just that one pin.

In other embodiment electronic device 110 may sense the plurality of test voltage values on-die from internal sense points (e.g., internal voltage monitors). Electronic device 110 may then communicate the plurality of test voltage values to controller 125 of power supply 115 or to control device 120 so that they may determine the target setpoint for power supply 115. This approach may compensate for voltage drop in electronic device 110 since it relies on voltage sense information on-die. However, with this approach there may be many points on electronic device 110 to be monitored by controller 125 or control device 120, one pin for each of the plurality of test voltage values from the internal sense points (e.g., internal voltage monitors).

In other embodiments, controller 125 of power supply 115 or control device 120 may determine the target setpoint for power supply 115 based on the plurality of test voltage values received from a plurality of sense points on PCB 105 underneath electronic device 110. Control device 120 may then communicate the target setpoint for power supply 115 to controller 125 of power supply 115. In the case where controller 125 determines the target setpoint for power supply 115, there may be no need to communicate the target setpoint because controller 125 may already have this information. This approach may be used with any electronic device because it may not rely on on-die sense pin availability. This approach, however, may not compensate for voltage drop in electronic device 110 based on on-die voltage sense information because it may rely on voltage sense information from PCB 105. Furthermore, with this embodiment when control device 120 is used to determine the target setpoint instead of controller 125, any standard power supply controller can be used to generate the voltage rail. In other words, when control device 120 is used to determine the target setpoint, conventional power supplies and conventional electronic devices may be used.

Regardless of where in operating environment 100 the target setpoint is determined, the target setpoint may be configured to both: i) cause a maximum of the voltage values at plurality of locations 130 to be below a maximum voltage level defined by a specification for electronic device 110; and ii) cause a minimum of the voltage values at plurality of locations 130 to be above a minimum voltage level defined by the specification for electronic device 110.

For example, the specification for electronic device 110 may define a voltage of 0.825 V+/−3% (i.e., +/−24.75 mV) for electronic device 110. Power supply 115 may be initially driven with a target set point of 0.825 V. However, the plurality of locations may be sampled and within the received plurality of test voltage values, the highest voltage seen may comprise 0.862 V, which is 37 mV higher than the 0.825 V value defined by the specification. Furthermore, this +37 mV value is above the maximum +24.75 mV range set by the specification for electronic device 110. In response, embodiments of the disclosure may decide to regulate the target setpoint down from 0.825 V to 0.81 V, so that the voltage at the lowest of the plurality of locations 130 location may be −1.8% lower than 0.825V (e.g., within the −3% target), but the voltage at the high point of the plurality of locations 130 may now be within the +3% target. Some embodiments may regulate the target setpoint to cause a difference between the maximum of the voltage values at the plurality of locations and the maximum voltage level defined by the specification to be equal to a difference between the minimum of the voltage values at the plurality of locations and the minimum voltage level defined by the specification.

Once the target setpoint for power supply 115 that supplies power to electronic device 110 is determined based on the plurality of test voltage values, in stage 220, method 200 may continue to stage 230 where power supply 115 may be driven at the target setpoint. For example, controller 125 may: i) drive power supply 115 at the target setpoint received from electronic device 110; ii) drive power supply 115 at the target setpoint received from control device 120; or iii) drive power supply 115 at the target setpoint that controller 125 itself determined. Once power supply 115 is driven at the target setpoint in stage 230, method 200 may then end at stage 240.

Because the voltage gradient on electronic device 110 may change dynamically (e.g., based on load on electronic device 110) method 200 may be performed periodically to respond to dynamic changes in the voltage gradient on electronic device 110. Moreover, software or firmware in operating environment 100 may predict an increase in current/load using a packet engine look-ahead type process for example. In response, the change in voltage setpoint may be communicated early enough so the voltage setpoint may be adjusted as the voltage gradient changes.

As stated above, the issue of voltage gradient across electronic device pins may be more prominent with large electronic devices (e.g., large ASICs). In a complex design adding more power planes to resolve the issue may add cost and sometimes may not be an option due to board thickness being at manufacturing limits. Consistent with embodiments of the disclosure, this problem may be mitigated by using multiple sense locations. The sensing device may cause the regulated voltage to be adjusted within specification at a lower cost without the need of adding more power planes for example.

Figure 3:
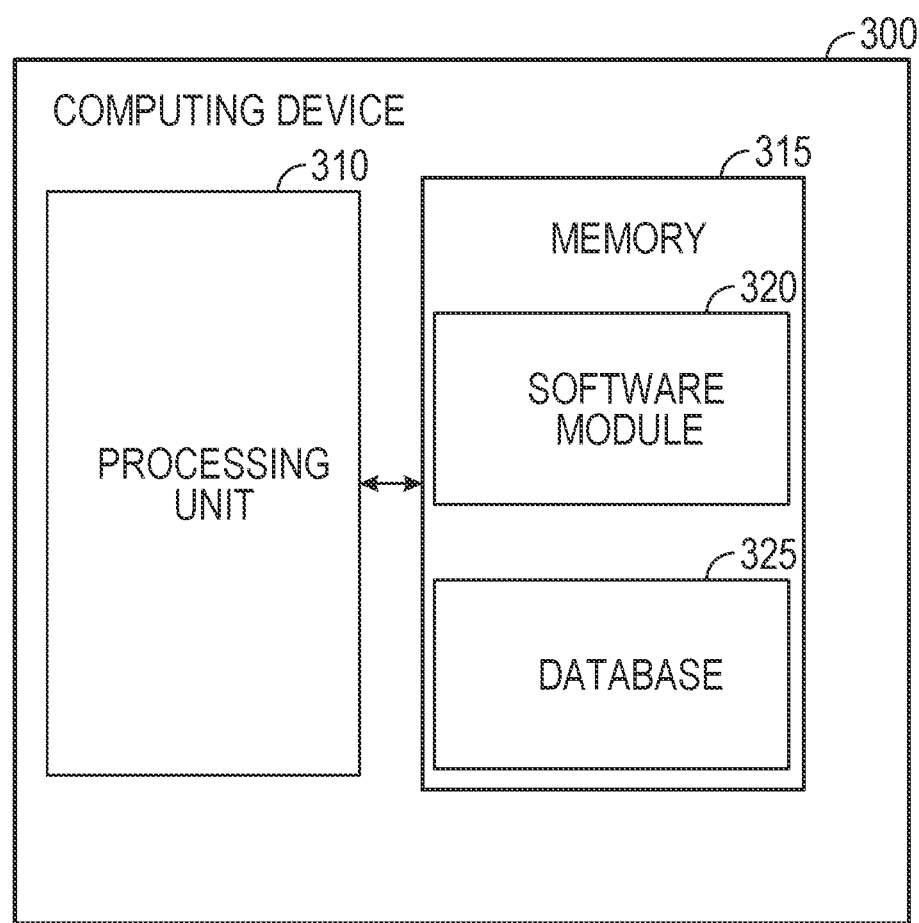
FIG. 3 is a block diagram of a computing device.

FIG. 3 shows computing device 300. As shown in FIG. 3, computing device 300 may include a processing unit 310 and a memory unit 315. Memory unit 315 may include a software module 320 and a database 325. While executing on processing unit 310, software module 320 may perform, for example, processes described above including providing regulation of a voltage gradient as described with respect to FIG. 2. Computing device 300, for example, may provide an operating environment for electronic device 110, power supply 115, control device 120, or controller 125. Electronic device 110, power supply 115, control device 120, or controller 125 may operate in other environments and are not limited to computing device 300.

Computing device 300 may be implemented using a Wi-Fi access point, a tablet device, a mobile device, a smart phone, a telephone, a remote control device, a set-top box, a digital video recorder, a cable modem, a personal computer, a network computer, a mainframe, a router, a switch, a server cluster, a smart TV-like device, a network storage device, a network relay devices, or other similar microcomputer-based device. Computing device 300 may comprise any computer operating environment, such as hand-held devices, multiprocessor systems, microprocessor-based or programmable sender electronic devices, minicomputers, mainframe computers, and the like. Computing device 300 may also be practiced in distributed computing environments where tasks are performed by remote processing devices. The aforementioned systems and devices are examples and computing device 300 may comprise other systems or devices.

An embodiment consistent with the disclosure may comprise a method for providing regulation of a voltage gradient. The method may comprise: receiving a plurality of test voltage values associated with a corresponding plurality of locations associated with an electronic device; determining, based on the plurality of test voltage values, a target setpoint for a power supply that supplies power to the electronic device, wherein the target setpoint is configured to cause a maximum of voltage values at the plurality of locations to be below a maximum voltage level defined by a specification for the electronic device and cause a minimum of the voltage values at the plurality of locations to be above a minimum voltage level defined by the specification for the electronic device; and causing the power supply to be driven at the target setpoint. The plurality of locations associated with the electronic device may comprise a corresponding plurality of voltage monitors located in the electronic device. The plurality of locations associated with the electronic device may comprise a corresponding plurality of pins external to the electronic device that are associated with a corresponding plurality voltage monitors located in the electronic device. The plurality of locations associated with the electronic device may comprise a corresponding plurality of sense points on a Printed Circuit Board (PCB) underneath the electronic device. Determining the target setpoint may comprise determining the target setpoint by a controller of the power supply. Determining the target setpoint may comprise determining the target setpoint by the electronic device. Determining the target setpoint may comprise determining the target setpoint by a device external to the power supply and external to the electronic device. A difference between the maximum of the voltage values at the plurality of locations and the maximum voltage level defined by the specification may be equal to a difference between the minimum of the voltage values at the plurality of locations and the minimum voltage level defined by the specification. The electronic device may comprise an Application-Specific Integrated Circuit (ASIC). The method may further comprise performing the stages of the method in response to a packet look-ahead engine predicting an increased load on the electronic device. The method may be repeated periodically.

Another embodiment consistent with the disclosure may comprise a system for providing regulation of a voltage gradient. The system may comprise a memory storage and a processing unit coupled to the memory storage. The processing unit may be operative to: receive a plurality of test voltage values associated with a corresponding plurality of locations associated with an electronic device; determine, based on the plurality of test voltage values, a target setpoint for a power supply that supplies power to the electronic device, wherein the target setpoint is configured to cause a maximum of voltage values at the plurality of locations to be below a maximum voltage level defined by a specification for the electronic device and cause a minimum of the voltage values at the plurality of locations to be above a minimum voltage level defined by the specification for the electronic device; and cause the power supply to be driven at the target setpoint. The processing unit may be disposed in a controller of the power supply. The processing unit may be disposed in the electronic device. The processing unit may be disposed in a device external to the power supply and external to the electronic device.

Yet another embodiment consistent with the disclosure may a computer-readable medium that stores a set of instructions which when executed perform a method for providing regulation of a voltage gradient executed by the set of instructions comprising: receiving a plurality of test voltage values associated with a corresponding plurality of locations associated with an electronic device; determining, based on the plurality of test voltage values, a target setpoint for a power supply that supplies power to the electronic device, wherein the target setpoint is configured to cause a maximum of voltage values at the plurality of locations to be below a maximum voltage level defined by a specification for the electronic device and cause a minimum of the voltage values at the plurality of locations to be above a minimum voltage level defined by the specification for the electronic device; and causing the power supply to be driven at the target setpoint. The plurality of locations associated with the electronic device may comprise a corresponding plurality of voltage monitors located in the electronic device. The plurality of locations associated with the electronic device may comprise a corresponding plurality of pins external to the electronic device that are associated with a corresponding plurality voltage monitors located in the electronic device. The plurality of locations associated with the electronic device may comprise a corresponding plurality of sense points on a Printed Circuit Board (PCB) underneath the electronic device. A difference between the maximum of the voltage values at the plurality of locations and the maximum voltage level defined by the specification may be equal to a difference between the minimum of the voltage values at the plurality of locations and the minimum voltage level defined by the specification.

Embodiments of the disclosure, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, floppy disks, or a CD-ROM, a carrier wave from the Internet, or other forms of RAM or ROM. Further, the disclosed methods' stages may be modified in any manner, including by reordering stages and/or inserting or deleting stages, without departing from the disclosure.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to, mechanical, optical, fluidic, and quantum technologies. In addition, embodiments of the disclosure may be practiced within a general purpose computer or in any other circuits or systems.

Embodiments of the disclosure may be practiced via a system-on-a-chip (SOC) where each or many of the element illustrated in FIG. 1 may be integrated onto a single integrated circuit. Such an SOC device may include one or more processing units, graphics units, communications units, system virtualization units and various application functionality all of which may be integrated (or "burned") onto the chip substrate as a single integrated circuit. When operating via an SOC, the functionality described herein with respect to embodiments of the disclosure, may be performed via application-specific logic integrated with other components of computing device 300 on the single integrated circuit (chip).

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. A method comprising:
   receiving a plurality of test voltage values associated with a corresponding plurality of locations associated with an electronic device;
   determining, based on the plurality of test voltage values, a target setpoint for a power supply that supplies power to the electronic device, wherein the target setpoint is configured to cause a maximum of voltage values at the plurality of locations to be below a maximum voltage level defined by a specification for the electronic device and cause a minimum of the voltage values at the plurality of locations to be above a minimum voltage level defined by the specification for the electronic device; and
   causing the power supply to be driven at the target setpoint.

2. The method of claim 1, wherein the plurality of locations associated with the electronic device comprise a corresponding plurality of voltage monitors located in the electronic device.

3. The method of claim 1, wherein the plurality of locations associated with the electronic device comprise a corresponding plurality of pins external to the electronic device that are associated with a corresponding plurality voltage monitors located in the electronic device.

4. The method of claim 1, wherein the plurality of locations associated with the electronic device comprise a corresponding plurality of sense points on a Printed Circuit Board (PCB) underneath the electronic device.

5. The method of claim 1, wherein determining the target setpoint comprises determining the target setpoint by a controller of the power supply.

6. The method of claim 1, wherein determining the target setpoint comprises determining the target setpoint by the electronic device.

7. The method of claim 1, wherein determining the target setpoint comprises determining the target setpoint by a control device external to the power supply and external to the electronic device.

8. The method of claim 1, wherein a difference between the maximum of the voltage values at the plurality of locations and the maximum voltage level defined by the specification is equal to a difference between the minimum of the voltage values at the plurality of locations and the minimum voltage level defined by the specification.

9. The method of claim 1, wherein the electronic device comprises an Application-Specific Integrated Circuit (ASIC).

10. The method of claim 1, further comprising performing stages of the method in response to a packet look-ahead engine predicting an increased load on the electronic device.

11. The method of claim 1, further comprising repeating stages of the method periodically.

12. A system comprising:
    a memory storage; and
    a processing unit, the processing unit coupled to the memory storage, wherein the processing unit is operative to:
    receive a plurality of test voltage values associated with a corresponding plurality of locations associated with an electronic device;
    determine, based on the plurality of test voltage values, a target setpoint for a power supply that supplies power to the electronic device, wherein the target setpoint is configured to cause a maximum of voltage values at the plurality of locations to be below a maximum voltage level defined by a specification for the electronic device and cause a minimum of the voltage values at the plurality of locations to be above a minimum voltage level defined by the specification for the electronic device; and
    cause the power supply to be driven at the target setpoint.

13. The system of claim 12, wherein the processing unit is disposed in a controller of the power supply.

14. The system of claim 12, wherein the processing unit is disposed in the electronic device.

15. The system of claim 12, wherein the processing unit is disposed in a control device external to the power supply and external to the electronic device.

16. A computer-readable medium that stores a set of instructions which when executed perform a method executed by the set of instructions comprising:
receiving a plurality of test voltage values associated with a corresponding plurality of locations associated with an electronic device;
determining, based on the plurality of test voltage values, a target setpoint for a power supply that supplies power to the electronic device, wherein the target setpoint is configured to cause a maximum of voltage values at the plurality of locations to be below a maximum voltage level defined by a specification for the electronic device and cause a minimum of the voltage values at the plurality of locations to be above a minimum voltage level defined by the specification for the electronic device; and
causing the power supply to be driven at the target setpoint.

17. The computer-readable medium of claim 16, wherein the plurality of locations associated with the electronic device comprise a corresponding plurality of voltage monitors located in the electronic device.

18. The computer-readable medium of claim 16, wherein the plurality of locations associated with the electronic device comprise a corresponding plurality of pins external to the electronic device that are associated with a corresponding plurality voltage monitors located in the electronic device.

19. The computer-readable medium of claim 16, wherein the plurality of locations associated with the electronic device comprise a corresponding plurality of sense points on a Printed Circuit Board (PCB) underneath the electronic device.

20. The computer-readable medium of claim 16, wherein a difference between the maximum of the voltage values at the plurality of locations and the maximum voltage level defined by the specification is equal to a difference between the minimum of the voltage values at the plurality of locations and the minimum voltage level defined by the specification.

* * * * *